United States Patent
Hirscht

(10) Patent No.: US 10,366,861 B2
(45) Date of Patent: Jul. 30, 2019

(54) HIGH VOLTAGE FEEDTHROUGH ASSEMBLY, TIME-RESOLVED TRANSMISSION ELECTRON MICROSCOPE AND METHOD OF ELECTRODE MANIPULATION IN A VACUUM ENVIRONMENT

(71) Applicant: Max-Planck-Gesellschaft zur Foerderung der Wissenschaften e. V., Munich (DE)

(72) Inventor: Julian Hirscht, Bad Oeynhausen (DE)

(73) Assignee: Max-Planck-Gesellschaft zur foerderung der Wissenschaften e.V., Munich (DE)

(*) Notice: Subject to any disclaimer, the term of this patent is extended or adjusted under 35 U.S.C. 154(b) by 0 days.

(21) Appl. No.: 15/503,571

(22) PCT Filed: Aug. 14, 2015

(86) PCT No.: PCT/EP2015/001685
§ 371 (c)(1),
(2) Date: Feb. 13, 2017

(87) PCT Pub. No.: WO2016/030004
PCT Pub. Date: Mar. 3, 2016

(65) Prior Publication Data
US 2017/0229276 A1    Aug. 10, 2017

(30) Foreign Application Priority Data

Aug. 25, 2014 (EP) .................................. 14002942

(51) Int. Cl.
*H01J 37/02* (2006.01)
*H01J 37/248* (2006.01)
(Continued)

(52) U.S. Cl.
CPC .......... *H01J 37/023* (2013.01); *H01J 37/065* (2013.01); *H01J 37/073* (2013.01); *H01J 37/248* (2013.01);
(Continued)

(58) Field of Classification Search
None
See application file for complete search history.

(56) References Cited

U.S. PATENT DOCUMENTS 3,978,363 A    8/1976 Bayless
4,008,413 A    2/1977 Bayless
(Continued)

FOREIGN PATENT DOCUMENTS

EP    0383988 B1    8/1993
EP    0556043 A1    8/1993
(Continued)

OTHER PUBLICATIONS

Harb et al. "Carrier relaxation and lattice healing dynamics in silicon revealed by femtosecond electron diffraction." The Journal of Physical Chemistry B 110.50 (2006): 25308-25313.
(Continued)

*Primary Examiner* — Wyatt A Stoffa
*Assistant Examiner* — James Choi
(74) *Attorney, Agent, or Firm* — Caesar Rivise, PC

(57) ABSTRACT

A high voltage feedthrough assembly for providing an electric potential in a vacuum environment comprises a flange connector being adapted for a connection with a vacuum vessel, a vacuum-tight insulator tube having a longitudinal extension with a first end facing to the flange connector and a second end being adapted for projecting into the vacuum vessel, and an electrode device coupled to the second end of the insulator tube, wherein the electrode device has a front electrode, including a photocathode or a
(Continued)

Figure 1:
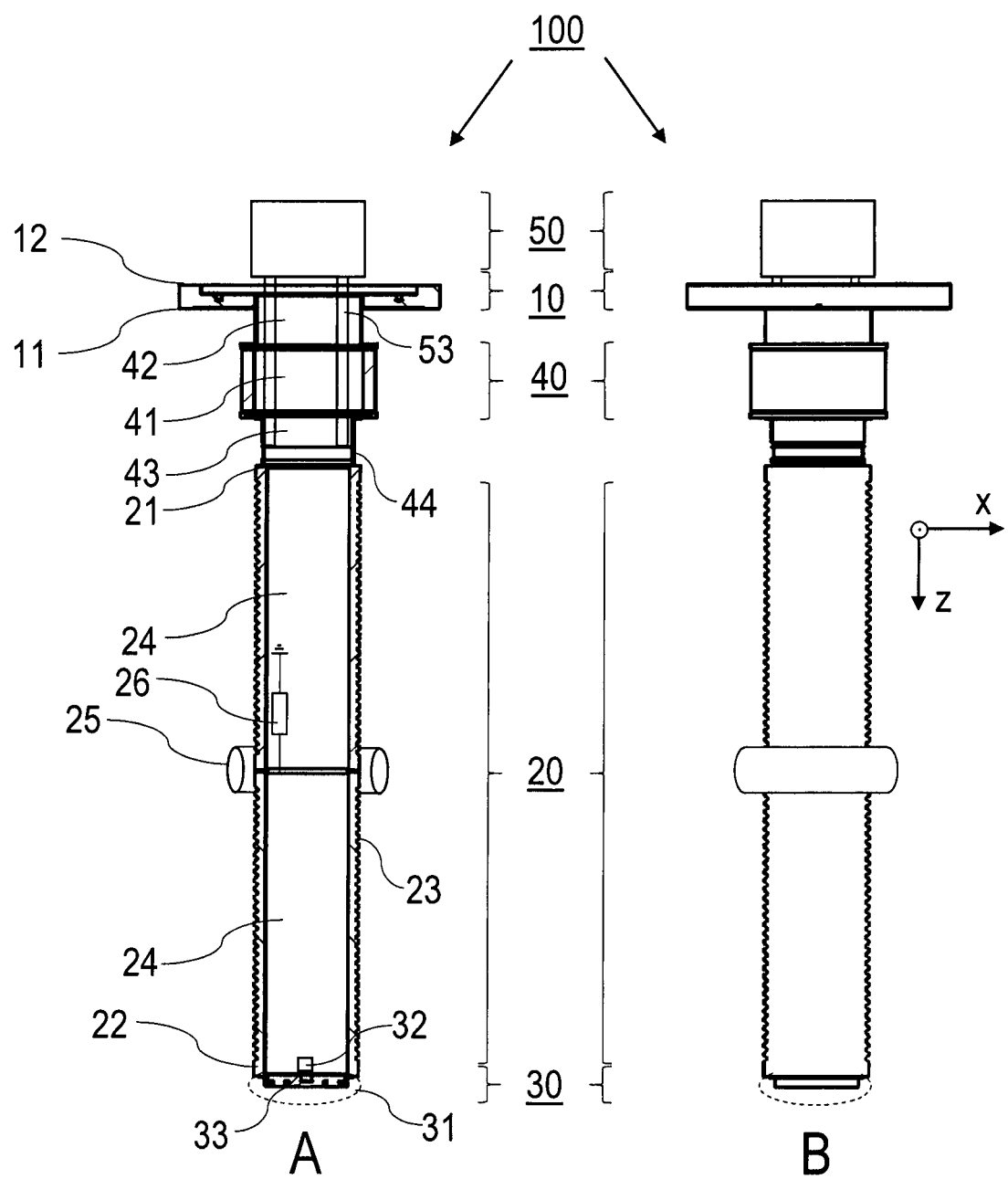

field emitter tip and facing to the vacuum vessel and a cable adapter for receiving a high-voltage cable, wherein a flexible tube connector is provided for a vacuum-tight coupling of the insulator tube with the flange connector, and a manipulator device is connected with the insulator tube for adjusting a geometrical arrangement of the insulator tube relative to the flange connector.

42 Claims, 10 Drawing Sheets

(51) Int. Cl.
- *H01J 37/26* (2006.01)
- *H01J 37/065* (2006.01)
- *H01J 37/073* (2006.01)
- *H01J 37/295* (2006.01)

(52) U.S. Cl.
CPC ............ *H01J 37/26* (2013.01); *H01J 37/261* (2013.01); *H01J 37/295* (2013.01); *H01J 2237/06333* (2013.01); *H01J 2237/06341* (2013.01); *H01J 2237/16* (2013.01)

(56) References Cited

U.S. PATENT DOCUMENTS

| | | | |
|---|---|---|---|
| 4,544,845 A | 10/1985 | Michel | |
| 5,929,373 A | 7/1999 | Schiavo et al. | |
| 7,085,351 B2 | 8/2006 | Lu et al. | |
| 8,039,765 B2 | 10/2011 | Bologa et al. | |
| 2005/0253069 A1* | 11/2005 | Zewail | H01J 37/065 250/311 |
| 2008/0135756 A1 | 6/2008 | Tanaka et al. | |
| 2012/0217391 A1* | 8/2012 | Shichi | H01J 27/26 250/306 |
| 2013/0264496 A1 | 10/2013 | Arai | |
| 2014/0152175 A1 | 6/2014 | Chang | |
| 2014/0168832 A1 | 6/2014 | Dittrich et al. | |
| 2015/0008323 A1 | 1/2015 | Arbouet et al. | |
| 2017/0076902 A1* | 3/2017 | Shichi | H01J 27/26 |

FOREIGN PATENT DOCUMENTS

| | | | | |
|---|---|---|---|---|
| EP | 1515806 B1 | | 3/2005 | |
| JP | S5184567 A | | 7/1976 | |
| JP | 55148357 A | * | 11/1980 | ............ H01J 37/073 |
| JP | H0254853 A | | 2/1990 | |
| JP | H07282755 A | | 10/1995 | |
| JP | 2002216686 A | | 8/2002 | |
| JP | 2007080697 A | | 3/2007 | |
| JP | 2008311174 A | | 12/2008 | |
| JP | 2010182466 A | | 8/2010 | |
| WO | 2011132767 A1 | | 10/2011 | |
| WO | WO 2011132767 A1 | * | 10/2011 | ............ H01J 37/08 |
| WO | 2013121021 A1 | | 8/2013 | |
| WO | 2014061625 A1 | | 4/2014 | |
| WO | 2014100835 A1 | | 6/2014 | |

OTHER PUBLICATIONS

Harrison. "A computer study of uniform-field electrodes." British Journal of Applied Physics 18.11 (1967): 1617-1627.
Miller et al. "'Making the molecular movie': first frames." Acta Crystallographica Section A: Foundations of Crystallography 66.2 (2010): 137-156.
Sciaini et al. "Femtosecond electron diffraction: heralding the era of atomically resolved dynamics." Reports on Progress in Physics 74.9 (2011): 096101, pp. 1-36.
Shibuya et al. "Development of an R&D Electrostatic septum for the 50-GeV Proton Synchrotron." Proc. of EPA62000. (2000): pp. 2465-2467.
Siwick et al. "Femtosecond electron diffraction studies of strongly driven structural phase transitions." Chemical Physics 299.2 (2004): 285-305.
English language abstract for JP H0254853 A (1990).
English language abstract for JP H07282755 A (1995).
English language abstract for EP 0383988 B1 (1993).
English language abstract for JP 2002216686 A (2002).
English language abstract for JP 2007080697 A (2007).
English language abstract for JP 2008311174 A (2008).
English language abstract for JP 2010182466 A (2010).
English language abstract for WO 2011132767 A1 (2011).
English language abstract for WO 2014061625 A1 (2014).
International Search Report from PCT/EP2015/001685 dated Mar. 9, 2016.

* cited by examiner

HIGH VOLTAGE FEEDTHROUGH ASSEMBLY, TIME-RESOLVED TRANSMISSION ELECTRON MICROSCOPE AND METHOD OF ELECTRODE MANIPULATION IN A VACUUM ENVIRONMENT

CROSS-REFERENCE TO RELATED APPLICATIONS

This application is the U.S. National Phase Application of PCT/EP2015/001685, filed Aug. 14, 2015, which claims priority from EP 14002942.2, filed Aug. 25, 2014, the contents of which applications are incorporated herein by reference in their entireties for all purposes.

The present invention relates to a high voltage feedthrough assembly providing an electric potential in a vacuum environment, in particular a high voltage feedthrough assembly, which is adapted for applying a high voltage to an electrode device inside a vacuum vessel. Furthermore, the invention relates to a time-resolved (pulsed) electron diffraction or imaging apparatus (time-resolved transmission electron microscope, TEM), being operable in a diffraction mode, thus providing an electron diffraction apparatus, in particular being adapted for time-resolved diffraction, e. g. nanocrystallography, or in an imaging mode, thus providing an electron imaging apparatus, including a photo-electric electron source and the high voltage feedthrough assembly for applying a voltage to the electron source. Furthermore, the invention relates to a method of manipulating an electrode device in a vacuum environment, wherein the high voltage feedthrough assembly is used. Applications of the invention are available with the operation of high voltage electrode devices in vacuum environments, e.g. electron sources in a TEM, in particular an electron diffraction apparatus, which is configured for time-resolved electron diffraction measurements, and/or an electron imaging apparatus, which is configured for time-resolved TEM imaging, or in a direct current injector for a synchrotron apparatus, or in radiation devices that use high electric potentials for the acceleration of charged particles, such as x-ray tubes that use electrons and negative (or positive) potentials.

In the present specification, reference is made to the following prior art illustrating the technical background of time-resolved electron diffraction measurements and techniques for applying high voltages in evacuated environments.

[1] G. Sciaini and R. J. D. Miller in "Reports on Progress in Physics", vol. 74, 2011, p. 096101;
[2] R. J. D. Miller et al. in "Acta Crystallographica", vol. A66, 2010, p. 137-156;
[3] B. J. Siwick et al. in "Chemical Physics", vol. 299, 2004, p. 285-305;
[4] S. Shibuya et al in "Proceedings of EPAC" 2000, Vienna, Austria, p. 2465;
[5] U.S. Pat. No. 7,085,351 B2;
[6] U.S. Pat. No. 5,929,373 A;
[7] EP 1 515 806 B1;
[8] U.S. Pat. No. 4,008,413;
[9] U.S. Pat. No. 3,978,363;
[10] EP 0 383 988 B1;
[11] WO 2011/132767 A1;
[12] JP 2002 216686 A;
[13] JP S51 84567 A;
[14] US 2013/264496 A1;
[15] WO 2014/061625 A1;
[16] EP 0 556 043 A1; and
[17] M. Harb et al. in "J. Phys. Chem. B" vol. 110, 2006, 25308-25313.

Electron diffraction is a well-known tool for structure investigations on an atomic scale. For dynamically measuring structural transitions on an atomic level, time-resolved electron diffraction measurements have been proposed. For obtaining a sufficient temporal resolution, electron pulses with a duration below 500 fs (fwhm) are transmitted through the sample under investigation (femtosecond electron diffraction). It has been proposed to use $4^{th}$ generation light sources, like e.g. the free electron laser FLASH or XFEL in Hamburg, Germany, for attaining short photon light pulses with a duration below 100 fs (fwhm), e. g. to investigate structures and dynamical structural changes. Photon light pulses have a restricted range of applications and can be used in connection with the complex photon machines only.

Another approach for attaining femtosecond electron pulses using a photoelectric electron gun in a vacuum vessel has been described in [1] to [3] and [17]. The photoelectric electron gun is based on an illumination of a photo-cathode with a fs-optical pulse and an acceleration of the generated photoelectrical electron pulse in an electrical field towards a pinhole anode or electrode at different potential. The accelerated electron pulse is collimated with a magnetic lens before or after the interaction with the sample under investigation and a diffraction or real-space imaging pattern is recorded with a detector. According to G. Sciaini and R. J. D. Miller [1], optical pulses of some hundreds fs (fwhm) have been used, and the electron pulses have been accelerated with a −55 kV voltage between the photo-cathode and the anode.

Although the photoelectric gun represents a promising and competitive alternative to $4^{th}$ generation light sources, there are still substantial limitations in terms of spatial and temporal resolution of the diffraction and real space imaging measurement using compact DC operated electron light sources. The electron pulse is subjected to a spatial broadening (spreading) resulting from the mutual repulsion of the electrons. The spatial and temporal resolution of the electron pulses can be improved by increasing the electric field strength in DC setups, i. e. increasing the acceleration voltage at fixed gap sizes or decreasing the distance between the photo-cathode and the anode at fixed voltages. However, changing the acceleration voltage and the photo-cathode-anode-distance for restricting the spreading of the electron pulses results in challenges, which have not yet been sufficiently solved with the conventional techniques, including the introduction of RF cavities as the partial or complete replacement of DC acceleration fields. Improved geometries in DC setups lead to electric field gradients of more than the conventionally used maximum of 10 MV/m in compact DC electron guns, even more than 20 MV/m and up to 30 MV/m were already reached in the gap between the electrode assembly and grounded pinhole anode. With these intense electric field gradients shorter electron pulses at higher pulse charges can be obtained and the brightness of the electron source substantially increased by at least an order of magnitude.

As an example, a commercial high voltage feedthrough has been used in [2] for applying −55 kV acceleration voltage to the photo-cathode over a distance of 6 mm, relating to a field gradient 9.2 MV/m ([17]). However, the commercial feedthrough design does not tolerate unlimited increasing of applied electric potentials, e.g. up to 300 kV or higher, as the extremely high electric field strength at the surface of the central electric conductor inside the feedthrough results in field emission of electrons, subsequently unintended charging of surrounding components and electric discharges that ultimately destroy the feedthrough. Another disadvantage of the experimental setup of [2] results from the geometry combining a backside illumination of the photo-cathode through a window of the vacuum vessel with an oblique orientation of the high voltage feedthrough relative to the electron path direction from the photo-cathode to the anode and the sample. The photo-cathode and anode are fixed in a support of the electron gun without any movability of the electrodes relative to each other. Furthermore, due to the oblique arrangement of the feedthrough, changing the position of the photo-cathode would require complex mechanical measures.

Figure 13:
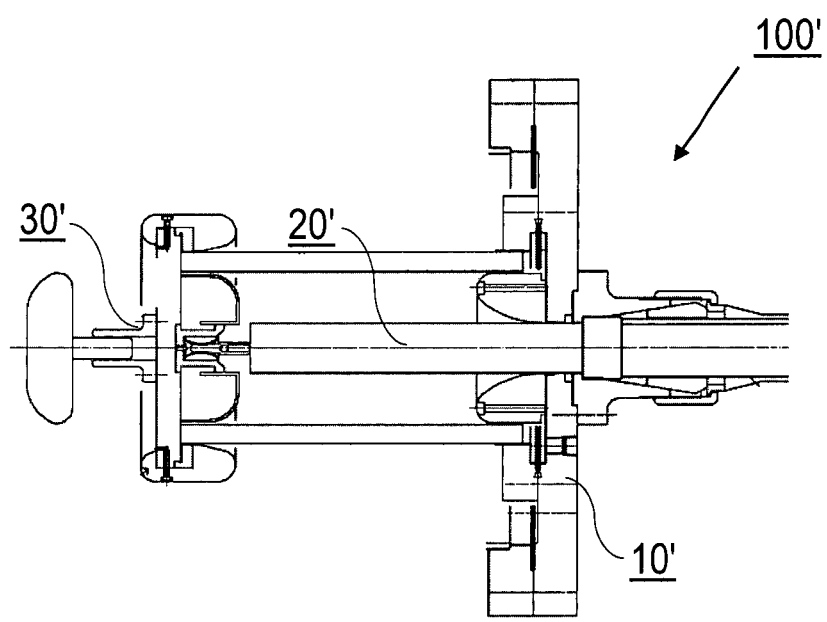

High voltage feedthrough assemblies are not only required for photoelectric electron guns, but also for other technical tasks requiring the provision of an electric potential (positive or negative) in a vacuum environment. As an example, a compact high voltage feedthrough for an application in a proton synchrotron is described in [4] as shown in FIG. 13 (prior art). This high voltage feedthrough 100' comprises a flange connector 10', an insulator tube 20' and an electrode device 30' with a cathode, and is designed for the application of voltages up to 200 kV to the electrode device 30' including a fine adjustment of the cathode position. As a disadvantage, the adjustment system (not shown in FIG. 13) is separated from the high voltage feedthrough 100', resulting in a complex structure which cannot be applied in a compact photoelectric electron gun as used for femtosecond diffraction measurements.

Further high voltage feedthrough concepts are described in [5] to [16]. These feedthrough structures are optimized for particular tasks, e.g. in an X-ray tube or an ion source or for reducing thermal strain at the feedthrough. [12] discloses an adjustable field emitter tip, wherein a tip holder is directly driven with an adjustment screw.

The objective of the invention is to provide an improved high voltage feedthrough assembly being capable of avoiding disadvantages and limitations of conventional techniques. In particular, the high voltage feedthrough is to be capable of providing potential differences higher than 200 kV, e. g. even higher than 300 kV. Furthermore, the high voltage feedthrough is to be capable to adjust an electrode position within a vacuum environment with improved flexibility and stability, while allowing a compact structure of the high voltage feedthrough and electron source. Furthermore, the objective of the invention is to provide an improved electron diffraction or imaging apparatus being capable of time-resolved electron diffraction or imaging investigations with improved spatial and/or temporal resolution. Furthermore, an objective of the invention is to provide an improved method of manipulating an electrode device in a vacuum environment, avoiding limitations of conventional techniques.

These objectives are solved with a high voltage feedthrough assembly, an electron diffraction or imaging apparatus adapted for static and/or time-resolved operation, and an electrode device manipulating method comprising the features of the independent claims, respectively. Preferred embodiments and applications of the invention are defined in the dependent claims.

According to a first general aspect of the invention, the above objective is solved by a feedthrough assembly being adapted for providing an electric potential in a vacuum environment. The feedthrough assembly comprises a flange connector, a vacuum-tight insulator tube and an electrode device. The flange connector is adapted for a vacuum-tight connection of the feedthrough assembly with a vacuum vessel, e.g. with the body (column) of an electron diffraction or imaging apparatus. The flange connector has an inner side and an outer side. When the feedthrough assembly is connected via the flange connector with the vacuum vessel, the inner side faces to an inner space of the vacuum vessel, while the outer side faces to the outer environment of the vacuum vessel. The insulator tube is a hollow component being made of an electrically insulating material and having a straight longitudinal extension. A first end (proximate end) of the insulator tube is facing to the flange connector, while a second end of the insulator tube projects away from the flange connector. When the feedthrough assembly is connected with the vacuum vessel, the insulator tube with the second end projects into the inner space of the vacuum vessel. The insulator tube is arranged within the vacuum vessel, wherein the inner space of the insulator tube is at atmospheric pressure and the outer surface of the insulator tube is exposed to the vacuum. The electrode device is coupled to the second end (distal end) of the insulator tube. Preferably, the second end of the insulator tube is closed by the electrode device, or alternatively by an adapter or a recipient that is part of a load lock or component exchange system. The electrode device includes a cable adapter for receiving a high voltage cable which can be fed through the insulator tube. Furthermore, the electrode device includes a front electrode facing away from the second end of the insulator tube, in particular into the inner space of the vacuum vessel.

The high voltage feedthrough assembly further comprises a flexible tube connector coupling the insulator tube with the flange connector in a vacuum-tight manner, and a manipulator device, which is fixedly connected with the insulator tube, e. g. directly with the insulator tube or with another part of an upper tube section, and which is capable of geometrically setting the insulator tube relative to the flange connector. Advantageously, the flexible tube'connector provides a movability of the insulator tube relative to the flange connector without a deterioration of the pressure tightness. When the feedthrough assembly is mounted to the vacuum vessel, the insulator tube having the front electrode at the second end thereof can be moved within the inner space of the vacuum vessel. Accordingly, the front electrode can be positioned within the vacuum vessel, in particular relative to a fixed component within the vacuum vessel, like a counter-electrode, by adjusting the geometrical arrangement of the insulator tube relative to the flange connector using the manipulator device.

According to the invention, the front electrode includes a photo-cathode or a field emission source with at least one field emitter tip. The photo-cathode or the at least one field emitter tip is included in the electrode device and exposed into the vacuum vessel. Contrary to the conventional feedthrough assemblies used for driving the photo-cathode in the conventional photoelectric electron guns, the inventive feedthrough assembly allows a flexible adjustment of the front electrode, which comprises the photo-cathode in a photoelectric electron gun or the field emission source. Furthermore, contrary to the techniques of [1] to [3] and [17], the insulator tube is adapted for a stable insulation at high voltages of at least 100 kV, e.g. at least 200 kV or even more than 300 kV. Contrary to the conventional adjustment in [4], the inventive feedthrough assembly has a compact structure as the manipulation device is connected with the insulator tube rather than being arranged with a distance thereof. The compact structure provides particular advantages for the application of the inventive feedthrough assembly for photoelectric electron guns.

The photo-cathode comprises a plane plate-shaped element including a metallic layer of photo-emitter material, like e. g. Ag, Al, Au, Cr, Cs, Mo, Nb, Ta, or carbon nanotubes, or semiconductive materials, such as Si or GaAs. Preferably, the photo-cathode comprises a transparent substrate, made of e. g. glass, carrying the layer of photo-emitter material.

The at least one field emitter tip is an advantageous alternative to a plane photo-cathode, since field emission sources provide an extended spatial coherence over photo-cathodes. This is important for both real space imaging of nanometer sized structures and diffraction by extended nanoparticulates, i.e. in nanocrystallography and the investigation of complex structures which exceed a few, e. g. 5, nanometres. The field emitter tip is e. g. a nanotip, a nanotip on a microchip or a Schottky field emission source, made of e. g. Mo, Nb, Ta or W. The field emitter tip can be arranged for an optically and/or electrically gated operation. Preferably, the flexible tube connector is adapted for a flexibility along all directions in space, in particular parallel and/or perpendicular to the longitudinal extension of the insulator tube. According to a preferred embodiment of the invention, the flexible tube connector comprises a bellows connector, which has advantages in terms of mechanical stability and flexibility. Alternatively, the flexible tube connector may have a structure comprising a flexible, vacuum-tight closing wall, made of e.g. a metal foil, and movable support rods.

According to a further preferred embodiment of the invention, the second end of the insulator tube is closed by a front plate. The electrode device is connected with the front plate. Advantageously, the front plate fulfils multiple functions of vacuum-tightly closing the insulator tube and mechanically carrying the electrode device, an adapter or recipient of a load lock system at the high potential. Additionally, the front plate can carry the high voltage cable adapter facing to the inner space of the insulator tube.

Additionally, the front plate can be provided with further features that allow the transmission of light via fiber-optical elements or further electric potentials to operate e. g. field emission tips. Thus, according to a particularly preferred embodiment of the invention, the front plate may include at least one optical connector and/or at least one electrical connector. The at least one optical connector supports an optical fibre extending from an inner space of the insulator tube towards the photo-cathode or the at least one field emitter tip. The at least one electrical connector supports an electrical supply line towards the field emitter tip or providing an exposed auxiliary electrode in the vacuum environment.

According to a further preferred feature of the invention, a fixed end of the flexible tube connector is coupled with the inner side of the flange connector. Preferably, a support tube is arranged between the inner side of the flange connector and the tube connector, e.g. the bellows connector. Advantageously, with the connection to the inner side of the flange connector, the compact structure of the feedthrough assembly can be improved. A movable end of the flexible tube connector is coupled with the insulator tube, preferably at the first end thereof. Alternatively, the movable end of the flexible tube connector can be coupled with the insulator tube at another position along the longitudinal extension thereof, e. g. in a neighbourhood of the second end of the insulator tube.

Generally, the manipulator device can be adapted for a motorized operation and/or a manual operation. The motorized operation has particular advantages for implementing a feedback control of the insulator tube and electrode device adjustment. Preferably, the manipulator device includes a drive unit acting on the insulator tube. Alternatively, the manual operation may have advantages for facilitating the adjustment by an operator of the feedthrough assembly, e.g. in an electron diffraction or imaging apparatus.

According to a preferred embodiment of the invention, the manipulator device is coupled with the flange connector. A fixed portion of the manipulator device is attached to the flange connector, while a movable portion of the manipulator device is attached to the insulator tube. Particularly preferred is an arrangement of the manipulator device on the outer side of the flange connector. Accordingly, when the feedthrough assembly is connected with the vacuum vessel, the manipulator device is arranged in the outer environment of the vacuum vessel, in particular at atmospheric pressure.

For the motorized operation, the manipulator device preferably comprises an actuator motor and a gear box being coupled with the insulator tube. Advantageously, the gear box allows a fine adjustment of the insulator tube with step movements in the sub-mm range.

As a further advantage of the invention, the manipulator device provides multiple degrees of freedom for the movement of the insulator tube relative to the flange connector. With the movement parallel to the longitudinal extension of the insulator tube, an axial movement is provided, while lateral movements are possible with translations in directions perpendicular to the longitudinal extension of the insulator tube. Additionally, a pivoting movement can be obtained, e.g. with a flexible bellows connector, resulting in an oblique arrangement of the insulator tube relative to the flange connector.

Advantageously, multiple design options are available for providing the insulator tube. Depending on the particular application of the invention, one or more of the following features can be used separately or in combination. Generally, the insulator tube is made of an electrically insulating material, preferably ceramic, like e.g. $A_2O_3$, or plastic material, like e.g. Polyoxymethylen (POM), cross-linked polyethylene (PE-X), or polyethylenterephthalat (PET).

According to a further preferred feature of the invention, the insulator tube has ripples on an outer surface thereof. With the ripples on the outer surface of the insulator tube, a co-linearity of electric field lines and creeping paths of electrons can be avoided. Advantageously, creeping currents and the risk of sparks are reduced by the ripples, so that the operation stability and durability of the insulator tube are improved. Ref. [4] has reported major problems in reaching the intended 200 kV. Here, the feedthrough has an extended life time as damages by electric discharges are minimized or even completely avoided, and voltages of 300 kV were already applied to the feedthrough assembly.

The inner space of the insulator tube is at atmospheric pressure. Accordingly, the insulator tube can be filled with a gas, like atmospheric air or an inert, dry gas. Alternatively, the insulator tube can be filled with a dielectric liquid, like a fluorocarbon-based fluid, e. g. Fluorinert (commercial name), a dielectric oil or other dielectric material, thus improving the shielding of a cable fed through the insulator tube in an advantageous manner.

An insulator tube can be made as an integral component, i.e. the insulator tube may completely consist of the insulating material, like the ceramic or plastic. This embodiment with one single insulator tube section is preferred with applications, where a relatively short insulator tube with a longitudinal length (depending on the voltage, e. g. below e.g. 50 cm) is sufficient.

Alternatively, in particular if longer insulator tubes are required for extremely high voltages, with a longitudinal length up to e.g. 6 m, the insulator tube can be made of two or more insulator tube sections. Using multiple insulator tube sections provides advantages for increasing the voltage supplied in the evacuated environment compared with [4]. The insulator tube sections are connected along the longitudinal extension of the insulator tube in a vacuum-tight manner. Preferably, the pressure tight connection of adjacent insulator tube sections is obtained with electrically conductive, metallic junctions, which can be shielded by shielding rings (or: shielding ring electrodes), made of e. g. stainless steel. Advantageously, each shielding ring electrode can be connected via an associated high-ohmic resistor with a neighbouring shielding ring electrode or ground. The junctions between the insulator tube sections can be discharged via the high-ohmic resistors, so that any charge-up of the insulator tube can be avoided. A controlled current allows the division of the maximum applied potential into equal fractions, each with a step of a few kV or more. Alternatively, the insulator tube sections are connected with dielectric and/or non-conductive materials, such as those mentioned above or e. g. epoxy glue.

As a further particular advantage of the invention, the features of the electrode device at the second end of the insulator tube can be adapted to the requirements of the particular application of the invention. The following preferred features can be implemented separately or in combination(s).

According to a particularly preferred embodiment of the invention, the electrode device comprises a first ring electrode surrounding the second end of the insulator tube in radial and axial directions relative to the longitudinal extension of the insulator tube. Advantageously, the first ring electrode, which is electrically connected with the front plate, provides an electrical shielding of the second end of the insulator tube to avoid excessive electric stress. Electrical field gradients at the second end of the insulator tube are equalised, so that the risk of unintended sparking is reduced.

The surface shape of the first ring electrode is selected such that field gradients are minimised in dependency on the local field strength. Accordingly, at the location of maximum field strength (around the center of the front electrode, typically on the axis of the insulator tube), field gradients or field enhancements are suppressed by an essentially plane surface shape, and with increasing distance from the location of maximum field strength, the surface shape of the front electrode is increasingly curved (e. g. sinusoidal shape). Depending on the application of the invention, preferred surface shapes are based on the Bruce profile or the Rogowski profile or another profile being adapted for generating a homogeneous electric field distribution in the centre thereof, i. e. in proximity of a central axis in the electron generation region, towards the anode device. Preferably, the profile is selected such that homogeneous fields are provided at various cathode-anode gap sizes. Alternatively, different electrodes shapes can be used for different gap sizes.

Different types of front electrodes are available, which can be selected for the particular application of the invention. According to a first embodiment of the invention, the front electrode includes the photo-cathode, which is exposed to the surrounding, in particular the inner space of the vacuum vessel. With the photo-cathode, the inventive high voltage feedthrough assembly provides a photo-electric electron gun, in particular for time-resolved femtosecond electron diffraction or time-resolved imaging applications. Alternatively, according to a second embodiment of the invention, the front electrode includes the at least one field emitter tip (or: nano-emitter), which is exposed to the surrounding, in particular to the inner space of the vacuum vessel. With this second embodiment, the inventive high voltage feedthrough assembly preferably is included in a transmission microscope for diffraction or imaging applications, which can be adapted for continuous or time-resolved imaging of samples.

For the electron gun application of the invention, the photo-cathode can be arranged for at least one of front and back side illumination. With the front side illumination, the photo-cathode is exposed such that it can be illuminated e.g. with laser pulses from the surroundings. With the back side illumination, the electrode device is adapted for providing a transparent light path to the back side of the photo-cathode. With back side illumination of the photo-cathode additional components are avoided in front of the electrode device, which could deteriorate the acceleration and/or time-resolved imaging using the electron pulses created at the photo-cathode.

According to a preferred modification of the electrode device, a second ring electrode is provided for connecting the front electrode with the first ring electrode. The second ring electrode has a hollow, cylindrical shape, wherein preferably an optical deflector device, e. g. a plane mirror, is arranged within the second ring electrode for directing an input laser beam onto the photo-cathode, in particular the back side thereof. Furthermore, the second ring electrode has at least one side opening for directing the input laser beam from an external laser source to the optical deflector device and further to the back side of the photo-cathode. The second ring electrode can also house further electronic control devices for the control of field emission tips. Even additional high voltage power supplies can be housed within the electrode assembly.

According to a further advantageous variant of the invention, a semi-transmissive optical deflector device can be used, which may comprise apertures for adjusting the input laser beam relative to the photo-cathode. The apertures can be arranged in radial directions relative to the longitudinal extension of the insulator tube before and after the optical deflector device such that if the input laser beam passes through both apertures, it is automatically deflected onto the back side center of the photo-cathode.

Additionally, a monitoring camera can be provided for monitoring a beam position of the laser input beam. The monitoring camera has advantages for implementing a feedback control of the geometric arrangement of the insulator tube with the electrode device.

Alternatively, the optical deflector device can be omitted. In this case, the back side illumination is provided with a light path of the input laser beam through the insulator plate via a window plate section of the front plate to the backside of the photo-cathode. Preferably, the insulator tube includes an inner tube, through which the light path of the input laser beam is guided. A first end of the inner tube can be coupled with the first end of the insulator tube, while a second end of the inner tube can be coupled with the front plate of the insulator tube at the location of the window plate section.

According to a further particularly advantageous embodiment of the invention, the high voltage feedthrough assembly includes a control loop for feedback controlling the electrode device position by driving the manipulator device in dependency on an electric, geometrical and/or optically measured quantity of the high voltage feedthrough assembly. With preferred examples, the electric measured quantity may comprise an electric current between the front electrode and a counter electrode in the vacuum vessel. A geometrical measured quantity may comprise e.g. a distance between the front electrode and the counter electrode. Finally, features of the input laser beam, as collected with the monitoring camera, can be used for testing and controlling the optimum position of the electrode device relative to the external laser source.

According to a further advantageous variant of the invention, the electrode device includes a power supply device being arranged for applying an additional potential and/or current to the front electrode, in particular to the field emitter tip, and/or to at least one auxiliary electrode being exposed towards the vacuum vessel. The power supply device is provided additionally to a high-voltage power supply of the electrode device. Advantageously, the additional power supply device can be used for providing an optically and/or electrically gated operation of the field emitter tip.

According to a further embodiment of the invention, the front plate comprises an adapter facing into the vacuum vessel, wherein the adapter is configured as a recipient in an electron source exchange system. Advantageously, the adapter allows an exchange of the electrode device or parts thereof.

According to a second general aspect of the invention, the above objective is solved with an electron diffraction or imaging apparatus, which is adapted for a time-resolved electron diffraction or imaging investigation of a sample and which comprises an electron source, optionally a laser pulse source, an anode device for accelerating electrons emitted from the electron source, a sample support, electron optics and a detector device. The electron source is a photoelectric electron gun comprising a photo-cathode or at least one field emitter tip. The photo-cathode or the at least one field emitter tip provide the front electrode of the inventive high voltage feedthrough assembly according to the above first aspect of the invention, while the anode device is fixedly positioned within the vacuum vessel of the electron diffraction apparatus. The fixed position of the anode device is preferred for a stable operation of the electron optics. The laser pulse source is arranged for illuminating the photo-cathode with an input laser beam, in particular with fs laser pulses. The sample support accommodates the sample to be investigated. Preferably, the sample support additionally fulfils cooling and/or heating capabilities. The electron optics images the electrons transmitted through the sample towards the detector device, which collects a sample image. Depending on the mode of operation, i. e. the diffraction mode or the imaging mode, the sample image includes a diffraction image and/or a spatial image to be obtained.

According to a preferred embodiment of the electron diffraction or imaging apparatus, the electron beam path from the electron source to the detector device defines an electron optical axis with a vertical orientation (parallel to gravitation). Contrary to the conventional techniques (see [1]), the vertical orientation allows a particularly compact structure of the electron diffraction or imaging apparatus and is advantageous for aspects of radiation safety.

According to a further preferred embodiment of the invention, the electron diffraction or imaging apparatus includes an electron source control device providing a feedback control of a voltage applied to the electron-source and/or a current applied to the electron-source and/or a position of the electron-source relative to the anode device.

The electron source control device allows an automated control of the electron source operation such that maximum acceleration voltages are obtained while sparking or other instabilities are avoided.

Advantageously, the electron diffraction or imaging apparatus can be provided with a streak camera being configured for at least one of an electron pulse analysis and time-resolved measurements.

According to a further preferred embodiments of the invention, the electron diffraction or imaging apparatus has a laser pulse source being arranged for illuminating the electron source. The laser pulse source can comprise a pulsed laser source or a continuous laser source. In particular, the laser pulse source can be adapted for time-resolved pump-probe measurements at the sample.

Preferably, the electron optics include strong and weak electron-optical lenses for real space and reciprocal space imaging, resp., and apertures and aberration correctors for image improvement. Advantageously, the strong and weak electron-optical lenses are adapted for the handling of short electron pulses for real space imaging with pulse durations shorter than 5 ns, preferably less than 10 ps. Thus, the time resolution is far better compared with conventional electron microscopes. The weak lens is a lens which is adapted for diffraction imaging, and it has a free aperture of e. g. above 30 mm. The strong lens is a lens which is adapted for real space imaging, and it has a smaller aperture than the weak lens and increased magnetic fields. Furthermore, moveable pinhole apertures, electrostatic deflectors and aberration correctors can be included in the electron optical system.

According to a further preferred embodiment of the invention, the anode device provides a single acceleration stage. Preferably, the electron-source and the anode device are configured for a potential difference exceeding 100 kV, 200 kV, or even 300 kV, and/or a field gradient exceeding 10 MV/m. Advantageously, the potential differences of conventional electron sources with a single acceleration stage are exceeded by a factor of 2 to 3. With the enhancement of the electric field above 10 MV/m, short electron pulses, e. g. <200 fs (fwhm), even <100 fs (fwhm) with increased electron numbers per pulse (e. g. $10^5$) can be obtained.

According to further advantageous embodiments of the invention, the electron diffraction or imaging apparatus comprises at least one auxiliary electrode that is included in the electrode device for controlling the field emitter tip.

Advantageously, the electron diffraction or imaging apparatus can be provided with a component exchange system being arranged for exchanging electron sources and/or electrodes.

According to a third general aspect of the invention, the above objective is solved with a method of manipulating an electrode device in a vacuum environment, e.g. in a vacuum vessel of an electron diffraction or imaging apparatus. According to the invention, the inventive high voltage feed-through assembly according to the above first general aspect is used for providing an electric potential within the vacuum environment. The inventive method includes a first step of connecting a high voltage cable with the cable adapter of the electrode device, and adjusting the geometrical arrangement of the insulator tube for setting the position of the electrode device. The positioning of the electrode device preferably comprises setting a predetermined distance between the front electrode and a counter-electrode, e. g. an anode, arranged in the vacuum environment. Preferably, the distance between the front electrode and the counter-electrode is feedback controlled in dependency on an electrical, geometrical and/or optical quantity as mentioned above.

The inventive high voltage feedthrough assembly has the following further advantages. The feedthrough design can hold potential differences of a few hundred keV up to 1 MeV to ground potential on the exterior and interior. The highest achievable voltage is merely dependent on the length and diameter of the feedthrough which is scalable with the applied voltage without a need to modify the inventive layout. Furthermore, the feedthrough assembly avoids field emission of electrons along the path of the feedthrough of the potential and/or electric current, and thus occurrences of electric breakdowns in proximity to the feedthrough are avoided. The feedthrough is radiation free, in particular if the front and any electric connection is properly shielded. Consequently, any stray radiation problems are supressed, and the radiation protection is eased.

The high voltage cable adapter design, preferably a female connector, is highly flexible to accommodate any type of high voltage cable. Furthermore, the interior of the insulated tube can be filled with varying dielectric insulators, which are dependent on the particular application. Thus, the feed-through design is highly flexible and universal applicable, also outside the scope of time-resolved diffraction and imaging with electron pulses.

With the flexible tube connector, in particular the flexible bellows, a varying cathode-anode distance is provided for. This feature has been proposed for the first time in particular for an electron diffraction or imaging setup. The distance variation allows various potentials to be applied to the electrodes, up to the maximum available potential of the power supply, always ensuring that the cathode-anode distance is kept at a minimum and the electric field gradient maximized so that the quickest acceleration of short electron pulses (hundreds to few ten femtoseconds and less) is given.

The cathode-anode distance can be optimised for any applied voltage by changing a gap distance there between.

In particular, the feedthrough position can be adjusted such that the apparatus is operated at extreme conditions, which is only limited by physical conditions, so that the photo-electric electron gun can be operated close to the electric discharge region.

Figure 2:
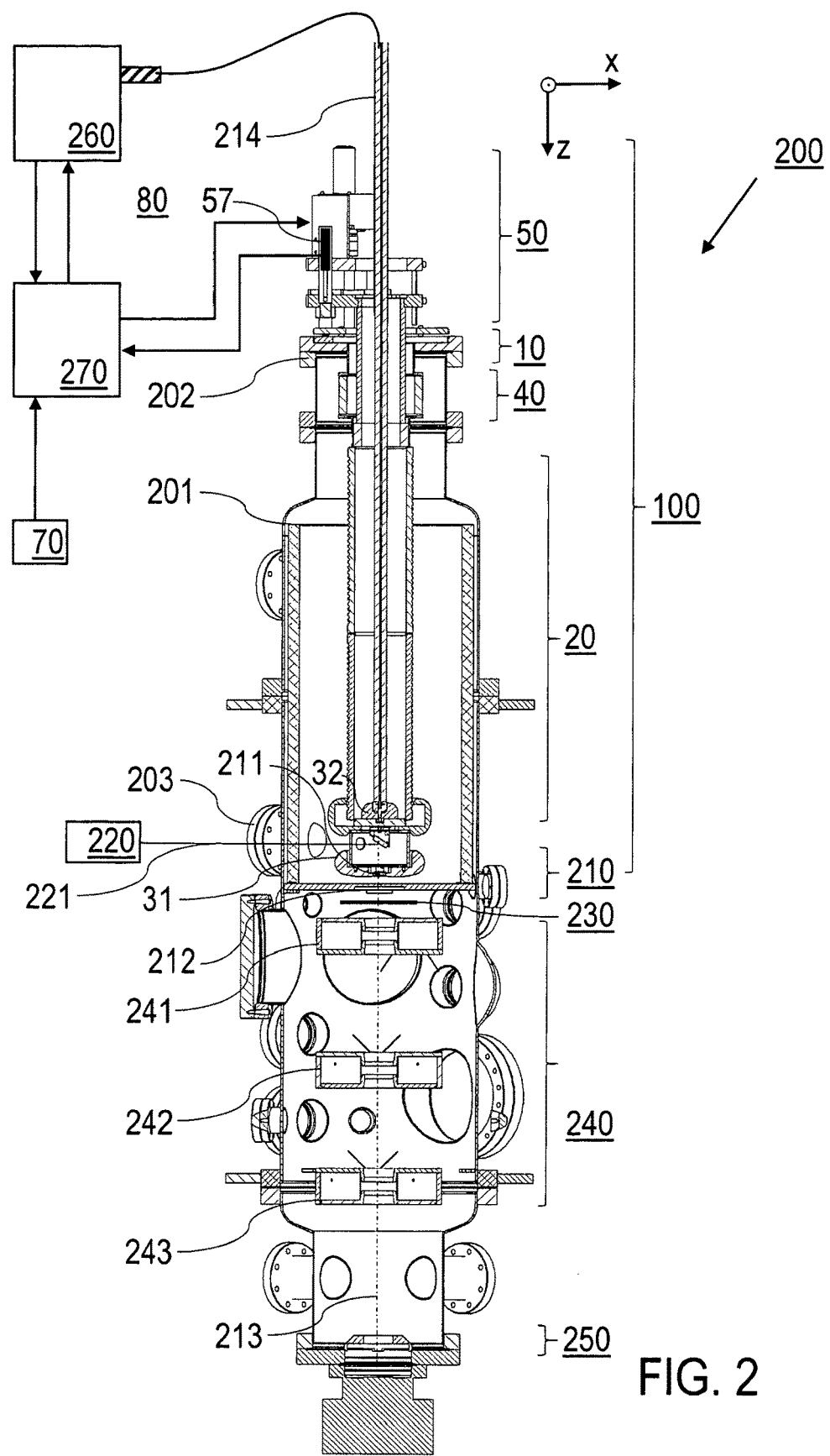
Figure 3:
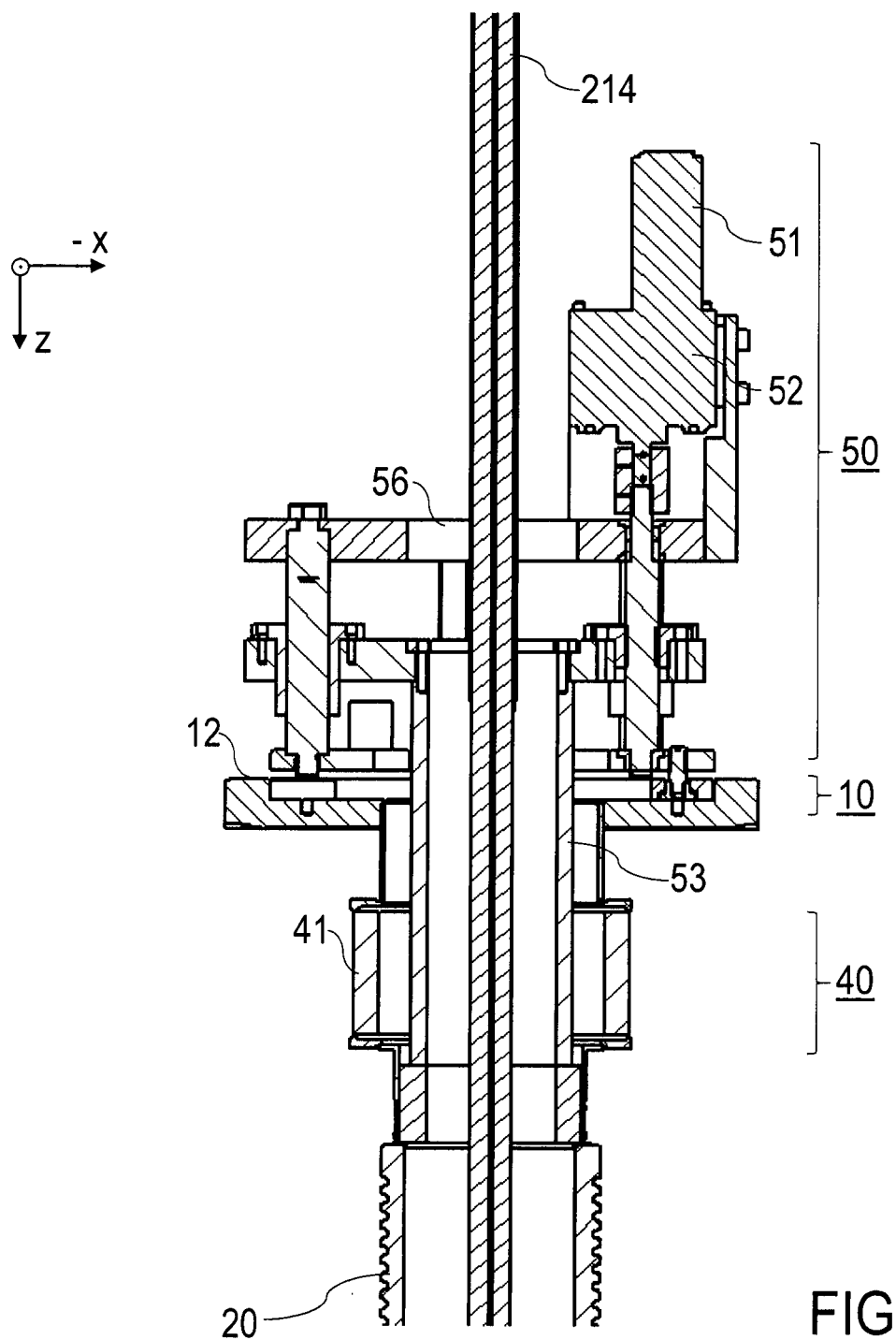
Figure 4:
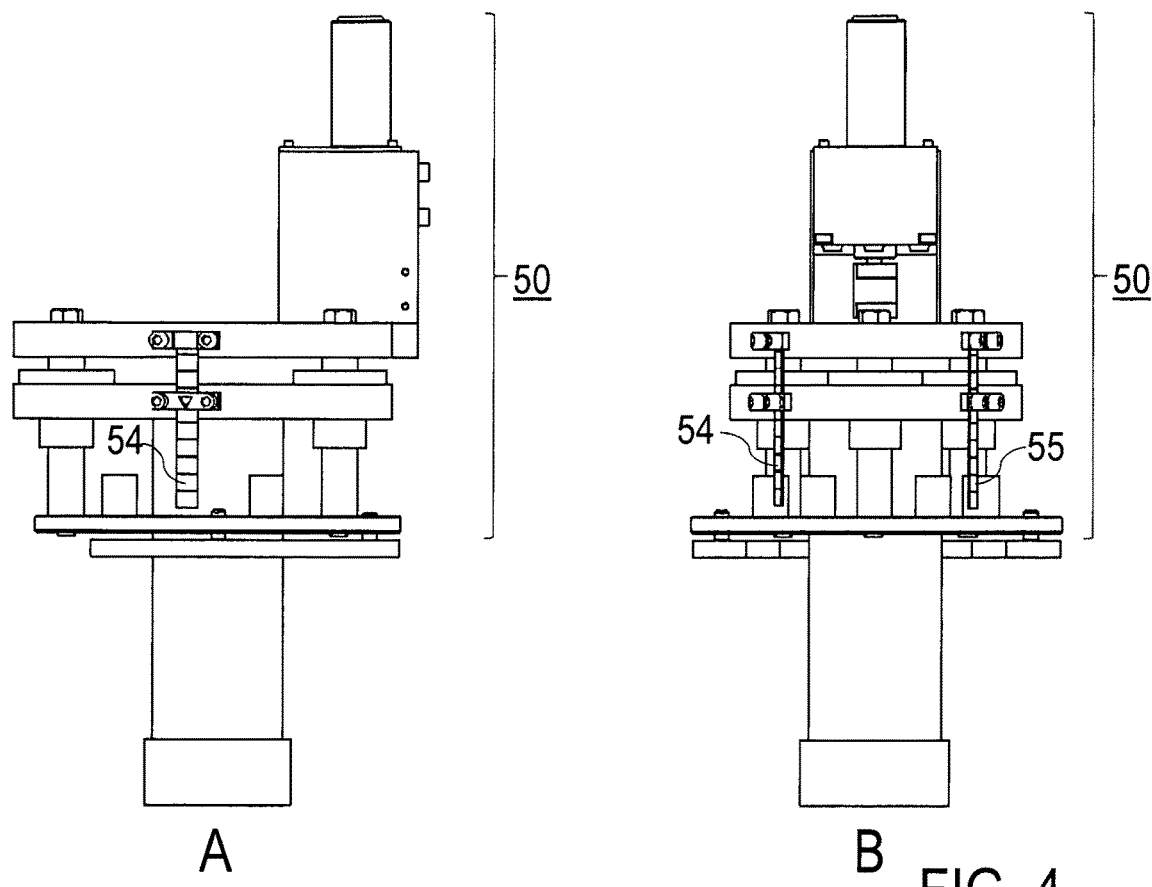
Figure 5:
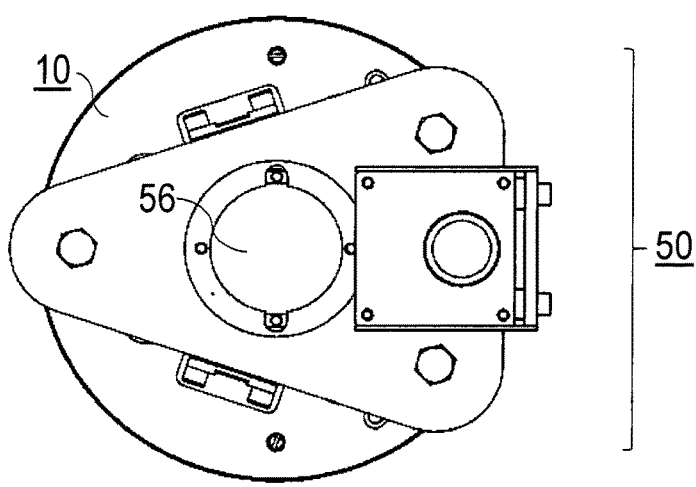
Figure 6:
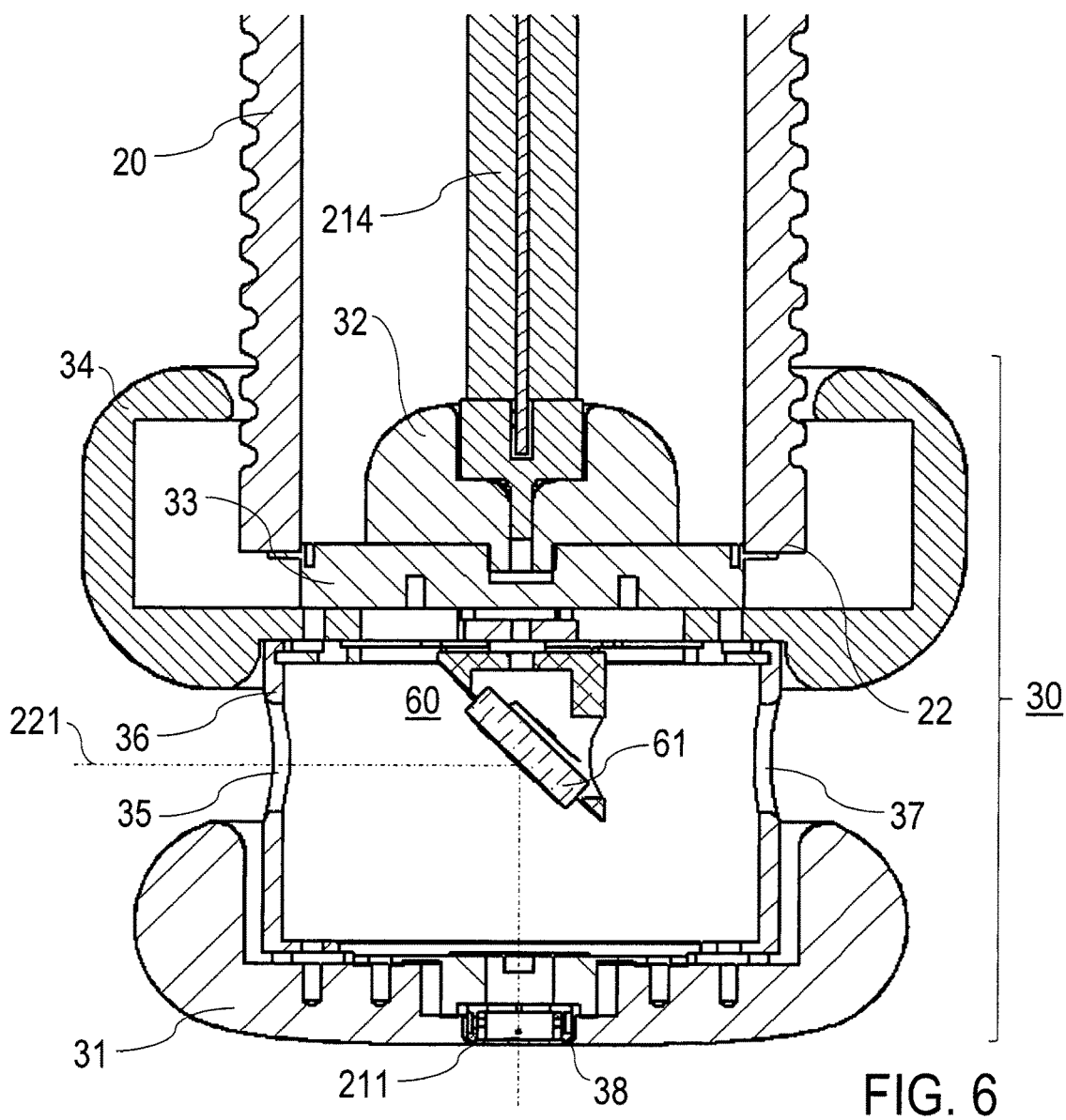
Figure 7:
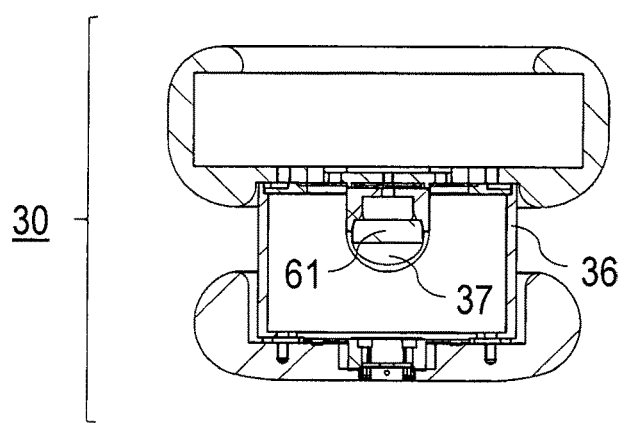
Figure 8:
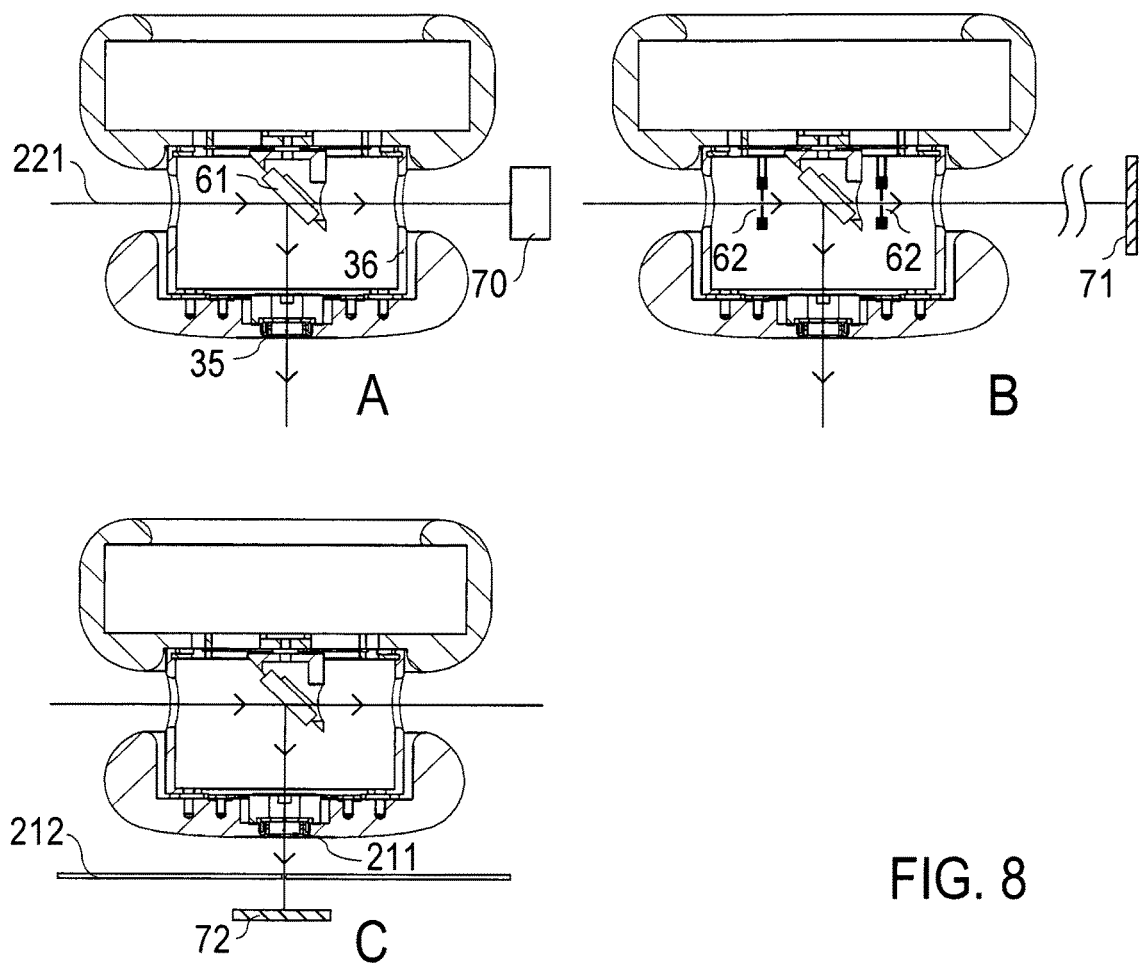
Figure 8:
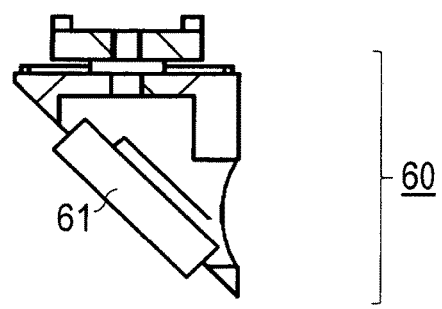
Figure 9:
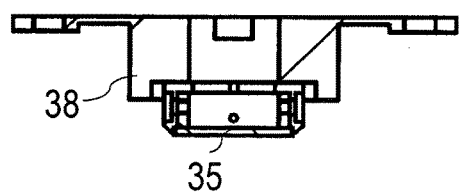
Figure 10:
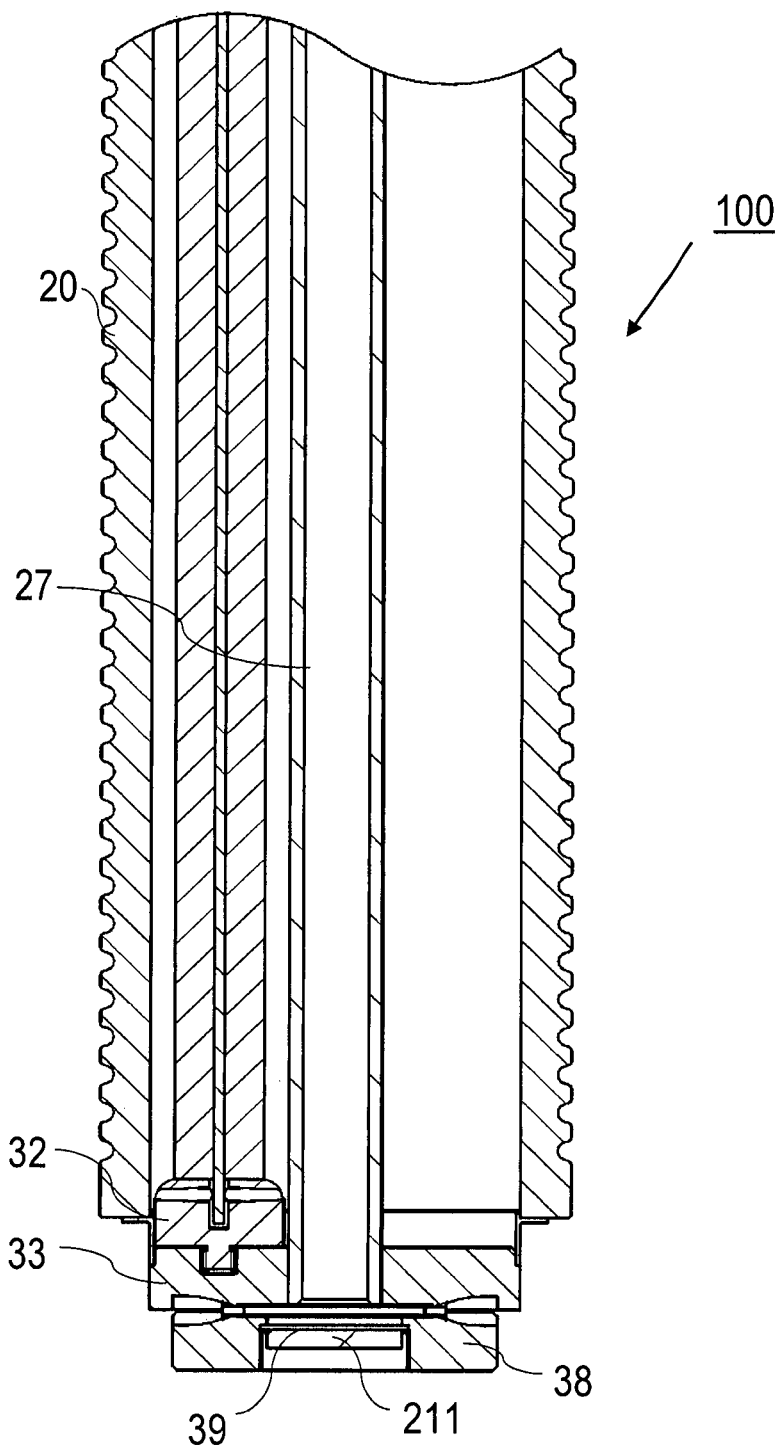
Figure 11:
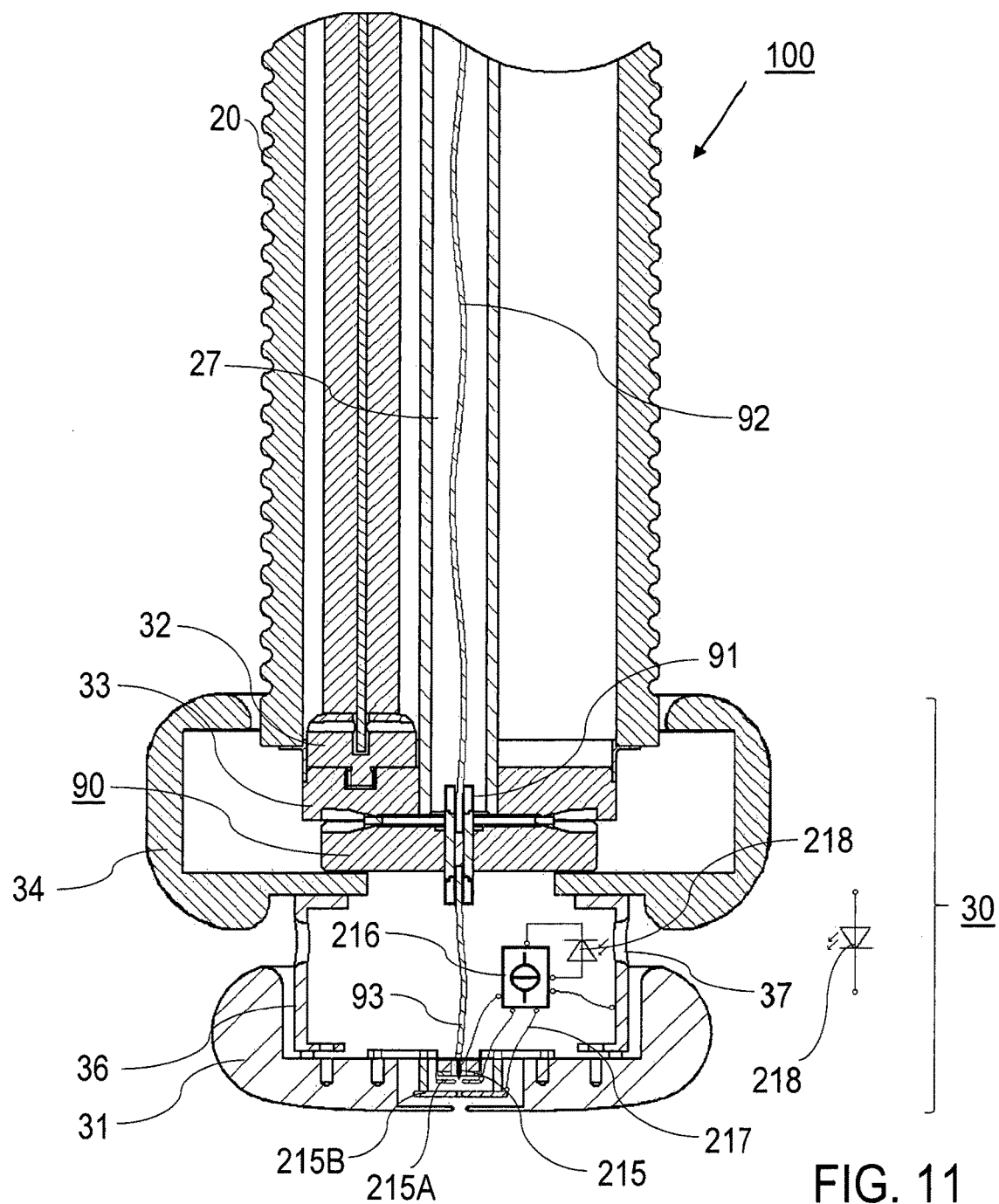
Figure 12:
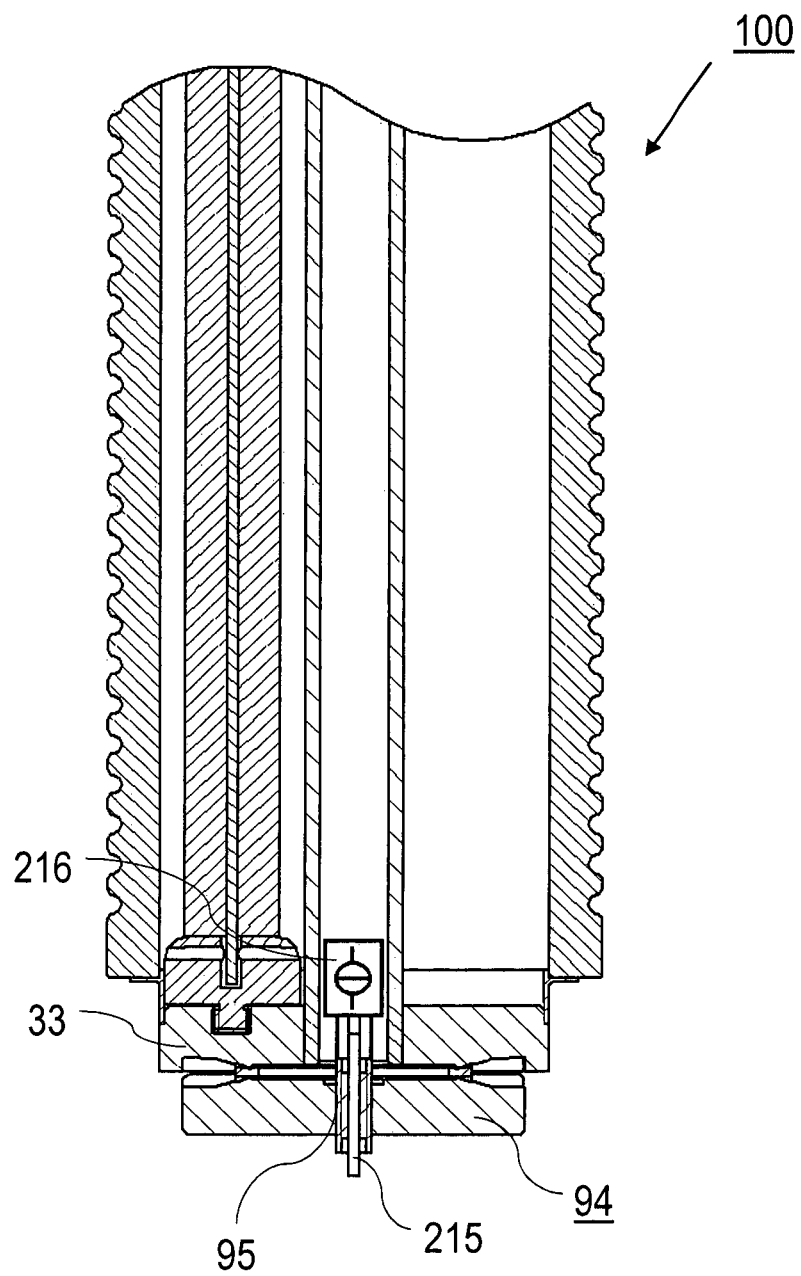

Further advantages and details of the invention are described in the following reference to the attached drawings, which show in:

FIG. 1: a cross-sectional view and a side view of a high voltage feedthrough assembly according to a preferred embodiment of the invention;

FIG. 2: a schematic cross-sectional view of a preferred embodiment of an electron diffraction or imaging apparatus according to the invention;

FIG. 3: a cross-sectional view of the manipulator device of the inventive feedthrough assembly;

FIGS. 4 and 5: further views of the manipulator device of FIG. 3;

FIG. 6: a cross-sectional view of the electrode device according to a preferred embodiment of the high voltage feedthrough assembly of the invention;

FIGS. 7 and 8: further views of the electrode device according to FIG. 6;

FIG. 9: a schematic illustration of an optical deflector device included in the electrode device of FIG. 6;

FIG. 10: a partial cross-sectional view of an alternative embodiment of the high voltage feed-through assembly according to the invention;

FIGS. 11 and 12: partial cross-sectional views of further alternative embodiments of the high voltage feedthrough assembly according to the invention; and FIG. 13: a schematic cross-sectional view of a conventional feedthrough assembly (prior art).

Features of preferred embodiments of the invention are described in the following with exemplary reference to a photoelectric gun for an electron diffraction or imaging apparatus, in particular for time resolved (femtosecond) electron diffraction or imaging investigations of a sample. It is emphasised, that the application of the invention is not restricted to this example. The inventive high voltage feedthrough can be used for other types of electrodes, like e.g. a field emitter electrode, and/or other applications as well, like an injector for a synchrotron apparatus. Details of operating a photoelectric source of electron pulses are not described as far as they are known from prior art, e.g. from [1]. Furthermore, features of the electron diffraction or imaging apparatus, the operation thereof, the sample preparation and the image analysis are not described as they are known as such from conventional techniques.

FIG. 1 illustrates a preferred embodiment of the high voltage feedthrough assembly 100 according to the invention with a cut view (FIG. 1A) and a side view (FIG. 1B). The high voltage feedthrough assembly 100 comprises a flange connector 10, an insulator tube 20, an electrode device 30, a flexible tube connector 40 and a manipulator device 50 (schematically shown, details see FIGS. 3 to 5).

The flange connector 10 is a standard flange for vacuum applications. It has an inner side 11, to which the insulator tube 20 is coupled via the flexible tube connector 40, and an outer side 12, where the manipulation device 50 is located. For the creation of an electric potential in a vacuum environment, e.g. a vacuum vessel 201 of an electron diffraction or imaging apparatus 200 (see FIG. 2), the flange connector 10 is coupled in a vacuum-tight manner with the wall of the vacuum vessel 201 (not shown in FIG. 1).

The insulator tube 20 is a hollow tube extending along a longitudinal direction (z-direction in FIG. 1), which is made of an insulating material, e. g. $Al_2O_3$. The insulator tube 20 has a first end 21 fixedly connected with the flexible tube connector 40 and a second end 22 carrying the electrode device 30. For a preferred example of providing a high voltage of about 300 kV at the electrode device, the insulator tube 20 has a longitudinal length of e.g. 600 mm, an inner diameter of 80 mm, a radial wall thickness of about 10 mm and outer surface ripples 23 with e.g. 2 ripples per cm and a ripple depth of e.g. 5 mm.

With the illustrated example, the insulator tube 20 comprises two insulator tube sections 24, which are connected via a metallic junction, made of e. g. Cu. The metallic junction is hard brazed to the adjacent ends of the insulator tube sections 24. A shielding ring electrode 25, made of e. g. stainless steel, surrounds the metallic junction, e. g. with a radial distance of about 70 mm. Preferably, the shielding ring electrode 25 has a curved surface, and it can be connected via the metallic junction and a high-ohmic resistor 26 with ground potential or with a neighbouring shielding ring electrode. FIG. 1A shows the resistor 26 being arranged inside of one of the insulator tube sections 24, e. g. at normal pressure. Alternatively, the resistor 26 can be arranged outside the insulator tube 20, i. e. on the vacuum side thereof. As a further modification of the illustrated embodiment, the insulator tube 20 can be made from an integral ceramic or plastics piece.

The electrode device 30 has a front electrode 31 (schematically shown in FIG. 1, details in FIGS. 6 to 8), to which the high voltage is to be applied. The front electrode 31 surrounds the second end 22 of the insulator tube 20. Furthermore, the electrode device 30 comprises a front plate 33, which closes the insulator tube 20 in a vacuum-tight manner. On an inner side of the insulator tube 20, the front plate carries a cable adapter 32 for receiving a high voltage cable (not shown in FIG. 1, details see FIG. 2). The front plate 33 is electrically connected with the cable adapter 32 and the front electrode 31.

The flexible tube connector 40 comprises a bellows connector 41, which is made e.g. of stainless steel. The fixed end of the flexible tube connector 40 is connected via a first rigid tube piece 42 with the inner side 11 of the flange connector 10. At the opposite side (movable end), the bellows connector 41 is connected via a second rigid tube piece 43 with a metal join ring 44, made of e.g. stainless steel and Cu, which is hard brazed with the first end 21 of the insulator tube 20. The bellows connector 41 provides an adjusting range of e. g. 1 cm up to 6 cm or even more.

The manipulator device 50 is fixedly connected with the outer side 12 of the flange connector 10. A rigid driven part of the manipulator device 50, like a support tube 53 is fixedly connected with the insulator tube 20. By operating the manipulator device 50, the insulator tube 20 can be moved with the support tube 53, while the vacuum-tight connection with the flange connector 10 is maintained by the flexible tube connector 40. Further details of the manipulator device operation are described below with reference to FIG. 3.

FIG. 2 schematically illustrates a cut view of a preferred embodiment of an electron diffraction or imaging apparatus 200 according to the invention. The electron diffraction or imaging apparatus 200 is shown without framing, which provides an outer mechanical support and without optional measures for radiation protection and homogenisation of the surrounding magnetic field. The electron diffraction or imaging apparatus 200 comprises a vacuum vessel 201, which is provided with the high voltage feedthrough assembly 100, an electron source 210, a laser pulse source 220, a sample support 230, electron optics 240, a detector device 250, a power source 260 and an electron source control device 270.

An electron-optical axis 213 extends from the electron source 210 via the sample support 230 and the electron optics 240 to the detector device 250. Preferably, the electron-optical axis runs parallel to, in particular coincidences with the longitudinal axis of the high voltage feedthrough assembly 100. In practical use, the electron diffraction or imaging apparatus 200 is arranged such that the electron-optical axis 213 has vertical orientation, i.e. parallel to the gravitational direction (z-direction). For obtaining a compact structure, the vacuum vessel 201 preferably has a longitudinal shape extending in the z-direction.

The high voltage feedthrough assembly 100 is an embodiment of the inventive feedthrough, in particular as described with reference to FIGS. 1 and 3 to 10. The flange connector 10 of the high voltage feedthrough assembly 100 is coupled in a vacuum-tight manner with the wall of the vacuum vessel 201, in particular with a vacuum flange 202 thereof. The insulator tube 20 with the electrode device 30 protrudes into the inner space of the vacuum vessel 201 with a surrounding clearance, so that the geometrical arrangement of the high voltage feed-through assembly 100, in particular the z-position, the x- and y-positions and/or the orientation thereof, can be freely adjusted with the manipulator device 50.

The electron source 210 comprises a photo-cathode 211 (diameter e. g. 16 mm), which is integrated into the front electrode 31 of the high voltage feedthrough assembly 100 and an anode device 212. The front electrode 31 with the photo-cathode 211 is described with further details with reference to FIG. 6 below. The anode device 212 comprises a plate shaped electrode with a through-hole (pinhole electrode) being connected with ground potential. The through-hole has a diameter of e. g. 0.025 mm to 0.5 mm. Preferably, the anode device 212 is fixedly arranged in the vacuum vessel 201, i.e. fixedly coupled with the wall of the vacuum vessel 201.

The laser pulse source 220 comprises a pulsed laser creating laser pulses with a centre wavelength e. g. in the visible, in particular green, or in the UV spectral range, a duration below 10 ns, 10 ps, 100 fs, in particular below 50 fs, and a repetition rate of e.g. 1 Hz to 200 kHz. With the preferred example, the laser pulse source 220 comprises a commercial device, like the Coherent Elite Duo laser system or the Pharos-SP laser system from Light Conversion. The laser pulse source 220 is arranged such that an input laser beam 221 of laser pulses can be directed via an input window 203 to the electrode device 30. Details of the optical beam path and optional beam path elements, like mirrors or imaging optics (not shown), inside and/or outside of the vacuum vessel 201 are selected by the user in dependency on the practical conditions in use.

The sample support 230 (schematically shown) is a usual support as it is known from electron microscopy, e.g. a support platform or a receptacle for a transfer device carrying the sample. A sample is positioned on the sample support 230 through a lock or load lock device as it is known from electron microscopy.

The electron optics 240 and the detector device 250 are provided as it is known from conventional electron microscopy. With a preferred example, the electron optics comprises two or more magnetic lenses 241 to 243 for imaging the electrons passing through the sample on the sample support 230 onto the detector device 250. As known from conventional TEMs, the electron optics 240 provide a diffraction image in the diffraction mode and a spatial image in the imaging mode. To this end, the electron optics 240 include strong and weak lenses, apertures, beam deflectors and aberration correction. The detector device 250 comprises e.g. an imaging sensor, based on a MOSFET matrix. The detector device 250 is connected with a main control unit (not shown) for recording, processing and/or displaying diffraction image data.

The power source 260 is connected via a high voltage cable 214 with the electrode device 30. The power source 260 is a commercial device supplying an output voltage of e.g. 300 kV or 400 kV with an output power of e.g. 600 W. Cable 214 comprises a shielded high voltage coaxial cable, which is coupled with a cable adapter 32 of the electrode device 30. The inner conductor of the coaxial cable has a diameter of e. g. 2.5 mm.

The power source 260 can be controlled manually and/or with the main control unit (not shown). Preferably, a feedback loop 80 is provided, wherein the power source 260 is controlled with the electron source control device 270. The electron source control device 270 receives a control variable from the electron source 210. The control variable comprises e.g. position data representing the current position of the photo-cathode 211 relative to the anode device 212 and/or an electrical current between the photo-cathode 211 and the anode device 212 and/or an electrical voltage between the photo-cathode 211 and the anode device 212. The position data can be obtained with an optical detection using a monitoring device 70 (see below, FIG. 8) and/or with a geometrical detection using at least one linear displacement sensor (linear potentiometer) 57 that returns an electric resistance in relation to a longitudinal position of the insulator tube 20. The electrical current and/or voltage can be measured at the power source 260. In dependency on the control variable, the power source 260 and/or the manipulator device 50 are set by the electron source control device 270, e. g. for maximizing the voltage at the photo-cathode 211 while preventing sparks.

With a preferred method of manipulating the electrode device 30 in the vacuum vessel 201, in particular for operating the electron diffraction or imaging apparatus 200, the high voltage cable 214 is connected with the electrode device 210. The cable 214 is fed through the high voltage feedthrough assembly 100 and coupled with the cable adapter 32. Subsequently, the geometrical arrangement of the insulator tube 20 in the vacuum vessel 201 is adjusted such that the electrode device 30 has a predetermined position in the vacuum vessel 201, in particular with reference to the anode device 212. This adjustment can be obtained with the feedback control using the electron source device 207 mentioned above. As an example, a distance of the photo-cathode 211 and the anode in a range up to 30 mm is adjusted.

FIG. 3 shows a cross-sectional view of the manipulator device 50, which is attached to the outer side 12 of the flange connector 10. FIGS. 4A and 4B and FIG. 5 show side-views and a top view of the manipulator device 50, respectively.

The illustrated example of the manipulator device 50 is a z-axis manipulator, which is adapted for a motorized translation of the insulator tube 20 (shown in part) parallel to the z-direction. Additionally, an adjustment in x-y-directions is provided by a three-point-mounting (see FIG. 5) of the manipulator device 50 on the flange connector 10. X- and y-manipulators can be used for the lateral movement of the feedthrough device. The manipulator device 50 comprises a schematically shown motor 51, which is connected via a gear box 52 and the support tube 53 with the insulator tube 20. For adjusting the insulator tube 20, the motor 51 is driven. The gear box 52 is connected via a clutch to a trapezoidal threaded rod, so that a motor rotation can be transmitted to a z-translation of the insulator tube 20. Furthermore, the manipulator device 50 includes an open space 56 (see FIG. 5) for passing the cable 214 to the insulator tube 20.

A first scale 54 (see FIG. 4) is provided for indicating the actual z-position of the electrode device at the second end of the insulator tube 20 relative to the flange connector 10, in particular the distance between the photo-cathode of the electrode device 30 and the anode device fixedly arranged in the vacuum vessel. The linear displacement sensor 57 shown in FIG. 2 can be attached in an orientation identical to the orientation of the first scale 54. A second scale 55 indicates the actual position of the membrane bellows.

FIG. 6 shows the second end 22 of the insulator tube 20 (see FIG. 1) and the electrode device 30 with further details. The insulator tube 20 is closed with the front plate 33 in a vacuum tight manner. On the inner side of the insulator tube 20, the front plate 33 carries the cable adapter 32 receiving the high voltage cable 214. The cable adapter 32 is e.g. a cable mount with a M12×1 tap hole.

The electrode device 30 comprises the front electrode 31 with the integrated photo-cathode 211, a first ring electrode 34 electrically shielding the second end 22 of the insulator tube 20, and a second ring electrode 36, which provides an electrical connection of the front electrode 31 and the first ring electrode 34 and a spacing for accommodating the optical deflector device 60.

The front electrode 31 has a curved outer surface with a smooth surface shape. As an example, the front electrode 31 is made of polished stainless steel. The surface shape is selected for minimizing field gradients around the photo-cathode 211, e.g. by using a Bruce or Rogowski profile. Depending on the particular application of the electrode device 30, another profile can be selected by the user, e.g. in dependency on the presence of components influencing the electric field in the neighbourhood of the front electrode 31. The outer diameter of the front electrode 31 is e. g. 120 mm.

Correspondingly, the first ring electrode 34 has a curved surface shape for minimizing electric field gradients. Preferably, the first ring electrode 34 is made of polished stainless steel as well.

The second ring electrode 36 is attached between the front electrode 31 and the first ring electrode 34, e.g. by screw and/or bayonet connections. The second ring electrode 36 is a hollow cylinder, made of e.g. steel. Advantageously, the pot-shaped second ring electrode 36 acts like a Faraday cage. Two through-holes 35, 37 are provided in the cylinder wall at mutually opposite locations. The input laser beam 221 is coupled through the first through-hole 35 to the optical deflector device 60, and the second through-hole 37 is provided for passing a part of the input laser beam 221 for control purposes (see below, FIG. 8A). The electrical connection between the cable 214 and the photo-cathode 35 is made via the cable adapter 32, the front plate 33, the second ring electrode 36 and the front electrode 31.

The optical deflector device 60, comprises a plane mirror 61 having a 45° inclination relative to the longitudinal axis of the insulator tube 20 and the optical axes of input laser beam 221. The mirror 61 comprises e.g. an Al mirror or a semi-transmissive mirror with a glass body and an Al coating. The input laser beam 221 is reflected by the mirror 61 to the photo-cathode 211, which is mounted to a photo-cathode holder 38. With the illustrated preferred example, the photo-cathode holder 38 comprises two clamps grip on the edges of the photo-cathode 211, which make the electric contact (see also FIG. 9).

FIG. 7 illustrates a reduced side-view of the electrode device 30 along the optical beam path of the input laser beam through the second ring electrode 36. The first through-hole 35 allows the direct illumination of the mirror 61.

FIG. 8A shows the optical beam path of the input laser beam 221. The main portion of the input laser beam 221 is reflected at the mirror 61 to the photo-cathode 35, while a fraction (e.g. 10%) is transmitted and exits on the opposite side of the second ring electrode 36. The reflection and transmission ratio depends on the wavelength of the input laser beam and the mirror coating. The transmitted fraction can be monitored with a monitoring device, e. g. a screen and/or a monitoring camera 70 for investigating a beam position. An output of the monitoring camera 70 can be supplied as a control variable to the electron source control device 270 (see FIG. 2) for adjusting the position of the electrode device 30. Additionally, the optical deflector device may comprise apertures 62 as shown in FIG. 8B. The apertures 62 are adapted for facilitating the adjustment of the input laser beam relative to the photo-cathode 35. As an example, the apertures 62 have a diameter of 0.5 mm to 3 mm. Again, the transmitted fraction of the input laser beam can be monitored with a screen 71 and/or a monitoring camera. With the apertures 62, it can be ensured that the incoming laser beam does always hit the centre of the mirror 61 and the photo-cathode 211. An alternative way of measuring a control variable is illustrated in FIG. 8C. Downstream from the anode device 212, an electron detector 72 can be provided for measuring the intensity of the electron current from the photo-cathode 211 to the anode 212.

FIG. 10 illustrates an alternative embodiment of a high voltage feedthrough assembly 100, which is adapted for a back-side illumination of the photo-cathode 211 (showing the front end of the feedthrough only). Not shown in FIG. 10 is a high voltage electrode (like the front electrode 31 described above), that would house and cover all of the front metal parts. With this embodiment, the metal front plate 33 includes a window plate section 39, which allows an illumination of the photo-cathode 211 through the insulator tube 20, in particular through an inner ceramic tube 27, which is arranged inside the insulator tube 20. Accordingly, the cable adapter 32 is asymmetrically placed. The advantage of this design is the disappearing need to readjust the laser beam position onto the photo-cathode 211 when the feedthrough 100 is moved up and down (if it was mounted vertically).

The inner ceramic tube 27 can be glued into the front plate 33, which is hard brazed via a small cupper ring to the front ceramic end. A hard brazing step of the inner ceramic tube 27 into the front plate 33 is also possible. Outside the inner ceramic tube 27, a closed and liquid tight volume is obtained which can be filled with a dielectric liquid, such as a fluorocarbon-based fluid, e. g. Fluorinert (commercial name), oil or others materials for the purpose of shielding the electrically charged components, and have the separation to the other channel in the centre of the inner ceramic tube 27. The CF copper gasket seals the rest of the vacuum vessel from the volume which would otherwise be connected via the inner ceramic pipe to the exterior. The other end of the feedthrough 100 can have the same flexibility in terms of x/y/z manipulation and pivot adjustments as described above.

The inner ceramic tube 27 is the pathway for the input laser beam through the rear side of the feedthrough 100. In this design the input laser beam can freely pass through the inner ceramic tube 27 and hit the window plate section 39, e. g. a glass plate, which is either mounted in a commercial viewport flange, which seals the vacuum from the vessel from the air or other medium inside the inner ceramic tube by a conventional copper gasket. It is possible to evacuate the inner ceramic tube 27 as well, but that would be a different vacuum volume compared to the vacuum volume inside the vacuum vessel.

The window plate section 39 could be covered with a thin layer of gold (or other metal, dependent on the applied laser wavelength) on the vacuum side, and directly be used as some sort of photo-cathode. Otherwise (as shown) it is passed by the input laser beam which then hits a photo-cathode 211 mounted in a holder 38 below.

Additionally, fibre optics can be used to guide laser beams/pulses to photo-active materials, and so can be used to operate field emission sources. As an example, FIG. 11 illustrates an embodiment of the inventive high voltage feed-through 100 including an optical connector 90 with an optical fibre feedthrough 91 accommodating optical fibres 92, 93.

With this embodiment, an inner ceramic tube 27 is arranged inside the insulator tube 20 and the metal front plate 33 carries the cable adapter 32 as shown in FIG. 10. Furthermore, the front plate 33 is coupled with the optical connector 90, which supports the optical fibres 92, 93. Additionally, the front plate 33 can include at least one electrical connector with a supply line contacting an exposed auxiliary electrode in the vacuum environment (not shown in FIG. 11).

The electrode device 30 of the high voltage feedthrough 100 comprises the front electrode 31 with the integrated field emitter tip 215, a first ring electrode 34 and a second ring electrode 36. The first and second ring electrodes 34, 36 are provided as described above with reference to FIG. 6. The second ring electrode 36 is attached between the front electrode 31 and the first ring electrode 34 with the shape of a hollow cylinder having at least one through-hole 37 in the cylinder wall.

The optical connector 90 includes the optical fibre feedthrough 91 which accommodates in a vacuum-tight manner the upper optical fibre 92 which is connected with a laser pulse source (not shown) and the lower optical fibre 93 which is directed to the field emitter tip 215. Alternatively, one single optical fibre can be used for guiding laser pulses to the field emitter tip 215.

The field emitter tip 215 is placed in a recess in the centre of the front electrode 31. Additionally, auxiliary electrodes, including an extractor electrode 215A being configured for field shaping and focussing electron packages emitted from the field emitter tip 215 and a further auxiliary electrode 215B, are arranged in the recess of the front electrode 31. The field emitter tip 215 comprises e. g. a Schottky field emission source. It can be triggered with laser pulses that are directed through the optical fibres 92, 93 towards the field emitter tip 215. The field emitter tip 215 is enclosed in the recess of the front electrode 31 in an environment of reduced electric fields, and it is surrounded by the extractor and auxiliary electrodes 215A, 215B. The tip is protected against the high potential drop of e.g. 300 kV that follows the outermost electrode 215B, but sees a potential drop of e.g. 5 kV.

The extractor and auxiliary electrodes 215A, 215B are powered via supply lines 217 by an additional power supply 216 contained inside the electrode device 30. Additionally, this power supply 216 is optically triggered via the through-hole 37 from the outside via optical diodes 218 (emitter outside and receiver inside the electrode device 30). The power supply 216 can be further used to drive a current through the field emitter tip 215, if e.g. a Schottky emitter is used, to drive a field emission current in combination with an optical trigger by laser pulses and the extractor and auxiliary electrodes 215A, 215B.

Alternatively, the embodiment of FIG. 11 can be provided with a photo-cathode instead of the field emitter tip. The photo-cathode can be arranged as shown in FIG. 10 with an illumination via an optical fibre as shown in FIG. 11.

FIG. 12 shows another embodiment of the inventive high voltage feedthrough 100, wherein an electrical connector 94 with a feedthrough 95 is coupled with the front plate 33 of the electrode device and a power supply 216 is connected to this feedthrough 95, e. g. for supplying the field emitter tip 215. The electrode device is not shown in FIG. 12, but can be provided as shown in FIG. 11.

The features of the invention disclosed in the above description, the drawings and the claims can be of significance individually, in combination or sub-combination for the implementation of the invention in its different embodiments.

The invention claimed is:

1. High voltage feedthrough assembly, which is configured for providing an electric potential in a vacuum environment within an electron diffraction or imaging apparatus, comprising:
   a flange connector being adapted for a connection with a column of the electron diffraction or imaging apparatus vacuum vessel, wherein the flange connector has an inner side facing into the vacuum vessel and an outer side facing to an environment of the vacuum vessel, a vacuum-tight electrical insulator tube having a longitudinal extension with a first end facing to the flange connector and a second end being adapted for projecting into the vacuum vessel, a flexible tube connector being adapted for a vacuum-tight coupling of the insulator tube with the flange connector, an interior of said flexible tube connector exposed to the environment of the vacuum vessel, a manipulator device connected with the insulator tube, wherein the manipulator device is adapted for adjusting a geometrical arrangement of the insulator tube relative to the flange connector, and an electrode device coupled to the second end of the insulator tube, wherein the electrode device has a front electrode outside the insulator tube and facing to the vacuum vessel and a cable mount inside the insulator tube for receiving a high-voltage cable, wherein the front electrode can be positioned within the vacuum vessel relative to a counter-electrode anode, fixed within the vacuum vessel, by adjusting the geometrical arrangement of the insulator tube relative to the flange connector using the manipulator device, wherein the manipulator device is capable of varying and subsequently maintaining a distance between the front electrode and the counter-electrode anode, wherein the front electrode includes a photo-cathode or a field emitter tip, being included in the electrode device and exposed to the vacuum vessel.

2. High voltage feedthrough assembly according to claim 1, wherein
the second end of the insulator tube is closed by a front plate, wherein the electrode device is connected with the front plate.

3. High voltage feedthrough assembly according to claim 2, wherein
the front plate includes at least one of at least one optical connector being adapted to support an optical fibre extending towards the photo-cathode or the field emitter tip and at least one electrical connector being adapted to support an electrical supply line towards the field emitter tip or providing an exposed auxiliary electrode in the vacuum environment.

4. High voltage feedthrough assembly according to claim 1, wherein
the flexible tube connector is coupled with the inner side of the flange connector.

5. High voltage feedthrough assembly according to claim 1, wherein
the manipulator device is connected with the flange connector.

6. High voltage feedthrough assembly according to claim 1, wherein
the manipulator device is arranged on the outer side of the flange connector.

7. High voltage feedthrough assembly according to claim 1, wherein
the manipulator device has an actuator motor and a gear box being coupled with the insulator tube.

8. High voltage feedthrough assembly according to claim 1, wherein
the manipulator device is adapted for an axial movement of the insulator tube and the electrode device parallel to the longitudinal extension of the insulator tube.

9. High voltage feedthrough assembly according to claim 1, wherein
the manipulator device is adapted for a lateral movement of the insulator tube and the electrode device perpendicular to the longitudinal extension of the insulator tube.

10. High voltage feedthrough assembly according to claim 1, wherein
the manipulator device is adapted for a pivoting movement of the insulator tube and the electrode device relative to the flange connector.

11. High voltage feedthrough assembly according to claim 1, wherein
the electrical insulator tube is made of ceramic or plastic.

12. High voltage feedthrough assembly according to claim 1, wherein
the electrical insulator tube has ripples on an outer tube surface.

13. High voltage feedthrough assembly according to claim 1, wherein
the electrical insulator tube is an integral component.

14. High voltage feedthrough assembly according to claim 1, wherein
the electrical insulator tube is made of at least two insulator tube sections being arranged along the longitudinal extension of the insulator tube and being connected by at least one of metallic junctions, dielectric junctions and non-metallic junctions resp.

15. High voltage feedthrough assembly according to claim 14, wherein
the at least two insulator tube sections are connected by metallic junctions, and
each metallic junction of two electrical insulator tube sections, resp., is shielded by a shielding ring electrode, and
a high ohmic resistor is connected between the shielding ring electrode and ground or a neighbouring shielding ring electrode.

16. High voltage feedthrough assembly according to claim 1, wherein
the electrical insulator tube is filled with a dielectric liquid.

17. High voltage feedthrough assembly according to claim 1, wherein
the electrode device comprises a first ring electrode being arranged for electrically shielding the second end of the insulator tube.

18. High voltage feedthrough assembly according to claim 1, including at least one of the features
the front electrode has a Bruce profile or a Rogowski profile, and
the front electrode is adapted for generating a homogeneous electric field distribution in the centre thereof towards the anode device.

19. High voltage feedthrough assembly according to claim 1, wherein the electrode device comprises the photo-cathode and wherein
the photo-cathode is a photo-cathode plate being arranged for a front side illumination.

20. High voltage feedthrough assembly according to claim 1, wherein the electrode device comprises the photo-cathode and wherein
the photo-cathode is a photo-cathode plate being arranged for a backside illumination.

21. High voltage feedthrough assembly according to claim 20, further comprising
a second ring electrode being arranged for electrically connecting the front electrode with the first ring electrode, wherein an optical deflector device is arranged in an inner space of the second ring electrode between the second end of the insulator tube and the front electrode, the optical deflector device being adapted for directing an input laser beam onto the photo-cathode, and the second ring electrode has at least one side opening for coupling the input laser beam to the optical deflector device.

22. High voltage feedthrough assembly according to the claim 21, wherein the optical deflector device comprises apertures for adjusting the input laser beam relative to the photo-cathode.

23. High voltage feedthrough assembly according to claim 21, further comprising a monitoring device being arranged for monitoring a beam position.

24. High voltage feedthrough assembly according to claim 20, wherein the front plate has a window plate section being arranged for the backside illumination, and the insulator tube includes an inner tube with a first end coupled with the first end of the insulator tube and a second end coupled with the front plate such that the backside illumination trough the inner tube hits the window plate section.

25. High voltage feedthrough assembly according to claim 1, further comprising a control loop being arranged for controlling the manipulator device in dependency on at least one of an electric, geometrical and optical measured quantity of the high voltage feedthrough assembly.

26. High voltage feedthrough assembly according to claim 1, wherein the electrode device includes an additional power supply being arranged for applying at least one of an additional potential and current to at least one of the front electrode, in particular to the field emitter tip, and an auxiliary electrode.

27. High voltage feedthrough assembly according to claim 2, wherein the front plate comprises an adapter facing into the vacuum vessel, wherein the adapter is configured as a recipient in an electron source exchange system.

28. High voltage feedthrough assembly according to claim 1, wherein the field emitter tip is at least one of optically and electrically gated.

29. Electron diffraction or imaging apparatus, being configured for a time resolved electron diffraction or imaging investigation of a sample, comprising:

a high voltage feedthrough assembly according to claim 1, an electron source comprising the front electrode of the high voltage feedthrough assembly, an anode device being arranged for accelerating electrons emitted from the electron source, a sample support being arranged for accommodating the sample, electron optics being arranged for providing a sample image, including at least one of a diffraction image and a spatial image, and a detector device being arranged for collecting the sample image.

30. Electron diffraction or imaging apparatus according to claim 29, wherein an electron optical axis from the electron source to the detector device has a vertical orientation.

31. Electron diffraction or imaging apparatus according to claim 29, further comprising an electron source control device being arranged for controlling at least one of a voltage applied to the electron source, a current applied to the electron source and a position of the electron source relative to the anode device.

32. Electron diffraction or imaging apparatus according to claim 31, further comprising a streak camera being configured for at least one of an electron pulse analysis and time-resolved measurements.

33. Electron diffraction or imaging apparatus according to claim 29, further comprising a laser pulse source being arranged for illuminating the electron source.

34. Electron diffraction or imaging apparatus according to claim 33, wherein the laser pulse source is a pulsed or continuous laser source being adapted time-resolved pump-probe measurements.

35. Electron diffraction or imaging apparatus according to claim 19, wherein the electron optics include strong and weak electron-optical lenses for real space and reciprocal space imaging, resp., and apertures, beam deflectors and aberration correctors for image improvement.

36. Electron diffraction or imaging apparatus according to claim 29, wherein the anode device provides a single acceleration stage.

37. Electron diffraction or imaging apparatus according to claim 29, wherein the front electrode and the anode device are configured for at least one of a potential difference exceeding 100 kV and a field gradient exceeding 10 MV/m.

38. Electron diffraction or imaging apparatus according to claim 29, comprising at least one auxiliary electrode being arranged for controlling the field emitter tip.

39. Electron diffraction or imaging apparatus according to claim 29, further comprising a component exchange system being arranged for exchanging at least one of electron sources and electrodes.

40. Method of manipulating an electrode device in a vacuum environment, using a high voltage feedthrough assembly according to claim 1, comprising the steps of connecting a high-voltage cable with the cable adapter of the electrode device, wherein the high-voltage cable is fed through the insulator tube, and adjusting the geometrical arrangement of the insulator tube relative to the flange connector using the manipulator device, such that the electrode device has a predetermined position in the vacuum environment.

41. Method according to claim 40, wherein the adjusting step includes positioning the electrode device such that the front electrode has a predetermined distance from a counter-electrode arranged in the vacuum environment.

42. Method according to claim 41, wherein the adjusting step includes feedback-controlling the distance between the front electrode and the counter-electrode.

* * * * *